United States Patent
Shalom et al.

(10) Patent No.: US 10,451,810 B1
(45) Date of Patent: Oct. 22, 2019

(54) ADAPTER FOR ELECTRICALLY CONNECTING A LASER DIODE TO A CIRCUIT BOARD

(71) Applicant: Corning Optical Communications LLC, Hickory, NC (US)

(72) Inventors: Ofer Shalom, Modi'in (IL); Motti Yakobi, Be'er Tuvia (IL)

(73) Assignee: Corning Optical Communications LLC, Charlotte, NC (US)

( * ) Notice: Subject to any disclaimer, the term of this patent is extended or adjusted under 35 U.S.C. 154(b) by 0 days.

(21) Appl. No.: 16/108,822

(22) Filed: Aug. 22, 2018

(51) Int. Cl.
| | |
|---|---|
| G02B 6/38 | (2006.01) |
| H01S 5/022 | (2006.01) |
| G02B 6/42 | (2006.01) |
| H04B 10/2575 | (2013.01) |
| H04B 10/00 | (2013.01) |
| H04B 10/50 | (2013.01) |

(52) U.S. Cl.
CPC ......... *G02B 6/3817* (2013.01); *G02B 6/4274* (2013.01); *H01S 5/02284* (2013.01); *H04B 10/12* (2013.01); *H04B 10/2575* (2013.01); *H04B 10/503* (2013.01); *H05K 2201/10121* (2013.01)

(58) Field of Classification Search
None
See application file for complete search history.

(56) References Cited

U.S. PATENT DOCUMENTS

| | | | | |
|---|---|---|---|---|
| 6,692,159 | B2 * | 2/2004 | Chiu .................... | G02B 6/3825 385/53 |
| 7,917,036 | B2 * | 3/2011 | Ori ........................ | G02B 6/4246 398/136 |
| 8,059,415 | B2 * | 11/2011 | Nelson ................. | G02B 6/4201 361/730 |
| 8,083,417 | B2 * | 12/2011 | Aronson .............. | G02B 6/3817 385/14 |
| 2004/0052478 | A1 | 3/2004 | Minamino et al. | |
| 2004/0114883 | A1 * | 6/2004 | Furuichi .............. | G02B 6/4206 385/93 |
| 2009/0129783 | A1 * | 5/2009 | Ori ........................ | G02B 6/4246 398/136 |
| 2014/0140665 | A1 * | 5/2014 | Akashi ................. | G02B 6/4281 385/89 |
| 2015/0163912 | A1 | 6/2015 | Reuven et al. | |
| 2016/0291271 | A1 * | 10/2016 | Mizobuchi .......... | G02B 6/4279 |
| 2017/0162987 | A1 * | 6/2017 | Kasturi ................ | H01R 24/50 |

* cited by examiner

*Primary Examiner* — Sung H Pak
(74) *Attorney, Agent, or Firm* — C. Keith Montgomery

(57) ABSTRACT

An adapter for electrically connecting a laser diode to a circuit board is disclosed. An example laser diode may form part of an optical communications system in which the laser diode emits optical signals into an optical fiber cable based on electrical signals received from one or more source circuits. The laser diode is electrically connected to the source circuit(s) through a circuit board. A laser diode adapter is provided to facilitate electrically connecting, as well as mechanically coupling, the laser diode to the circuit board. In this regard, the laser diode adapter includes conductive pads for coupling to conductive legs of the laser diode. The laser diode adapter also includes a set of conductive signal pads for coupling to conductive receiving pads which are electrically connected to the conductive pads, thereby electrically connecting the conductive legs of the laser diode to the circuit board.

13 Claims, 8 Drawing Sheets

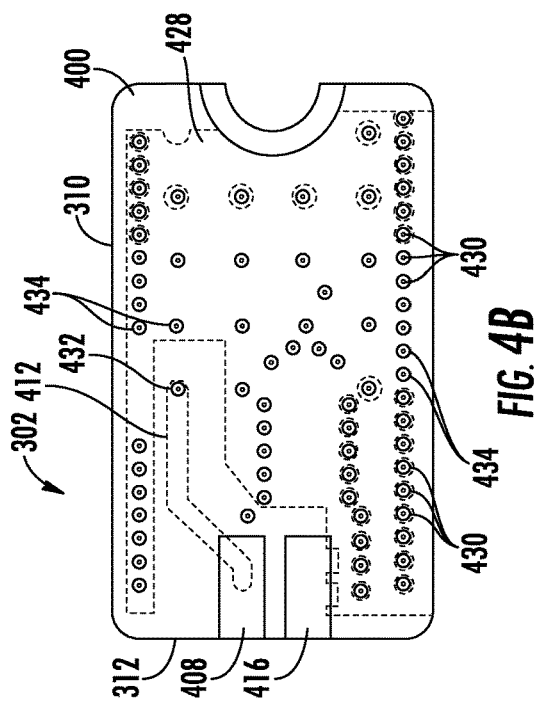
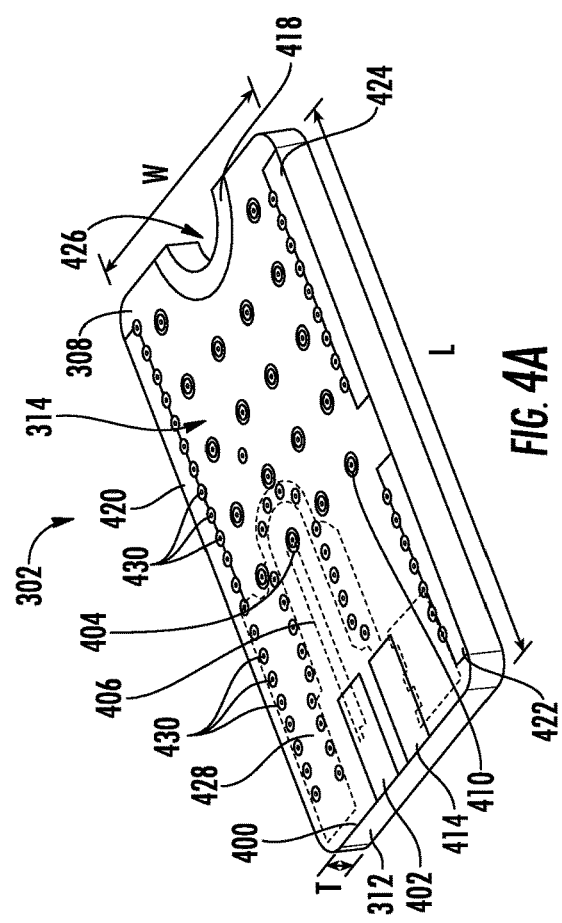
FIG. 4B
FIG. 4A

ADAPTER FOR ELECTRICALLY CONNECTING A LASER DIODE TO A CIRCUIT BOARD

BACKGROUND

The disclosure relates to coupling electronic devices with circuit boards, and more particularly to an adapter for electrically connecting a laser diode to a circuit board.

In optical communications, a laser diode transmits optical signals through an optical medium, such as an optical fiber cable. The optical signals are transmitted in response to electrical signals received through conductive electrodes of the laser diode, typically referred to as legs (e.g., two or more of which can protrude from the laser diode in parallel). Under a traditional approach, the legs of the laser diode are connected to conductors of a printed circuit board (PCB) by bending the legs and soldering each leg to the respective conductor. However, bending the legs may cause stress in an enclosure of the laser diode (e.g., by causing cracking in a glass feed-through of the laser diode and/or otherwise reducing mean time between failures), require complex labor which may not be able to be automated, and may require the legs to be relatively long so that they can be soldered in the same plane, which may negatively impact radio frequency performance, such as bandwidth.

One proposed solution to avoid bending the legs of the laser diode is presented in FIGS. 1-2B. FIG. 1 is a schematic diagram of a multilayer PCB 100 having a protruding portion 102 of some layers for coupling to a laser diode 104. FIG. 2A is a schematic cross-sectional view of the multilayer PCB 100 of FIG. 1 taken at line A-A, illustrating layers 200 of the multilayer PCB 100. Referring to FIGS. 1 and 2A, the laser diode 104 includes a base 106 through which elongate conductive contacts, leads or legs 108 extend. A through-hole 110 is formed in the multilayer PCB 100 in which the protruding portion 102 is disposed, and the laser diode 104 is positioned in the through-hole 110 and coupled to the protruding portion 102. The laser diode 104 is mounted to the multilayer PCB 100 by soldering the legs 108 to corresponding conductors 112 on the protruding portion 102.

In order to form the protruding portion 102, the multilayer PCB 100 includes the compound through-hole 110 and cavity 114 (e.g., cut-out). As illustrated in FIG. 2A, the through-hole 110 is defined by both upper and lower portions 202, 204 of the layers 200 of the multilayer PCB 100, and the cavity 114 is generally defined by the upper portion 202, wherein the cavity 114 is laterally open to the through-hole 110. This may be accomplished through techniques such as providing the upper portion 202 having the cavity 114 defined therein, providing the lower portion 204 having the through-hole 110 defined therein, and securing the upper portion 202 to the lower portion 204 in the stacked arrangement by laminating or other fastening techniques. The lower portion 204 also includes the conductors 112 which are electrically connected to the legs 108 of the laser diode 104. Electrical connections are also made between the upper portion 202 and the lower portion 204 of the multilayer PCB 100 to connect the conductors 112 to other components mounted on the multilayer PCB 100.

This technique of mounting the laser diode 104 to the multilayer PCB 100 at the protruding portion 102 seeks to overcome the problems described above from bending or otherwise deforming the legs 108 by providing the protruding portion 102 as a mounting point which avoids the need to deform the legs 108 of the laser diode 104. However, this technique requires complex manufacturing of the multilayer PCB 100, including forming separate upper and lower portions 202, 204 which are interconnected and laminated together. In addition, as depicted in FIG. 2B, mounting the laser diode 104 to the protruding portion 102 can place the laser diode 104 in an undesirable position for coupling to an optical fiber cable 206.

FIG. 2B is another schematic cross-sectional view of the multilayer PCB 100 of FIG. 1 taken at line A-A. As shown in FIG. 2B, an end of the laser diode 104 may be coupled to an end of an optical fiber cable 206 for transmitting optical signals through the optical fiber cable 206 in response to electrical signals being supplied to the laser diode 104 from the multilayer PCB 100 by way of the legs 108. By mounting the laser diode 104 to the protruding portion 102 of the multilayer PCB 100, the laser diode 104 is recessed into the through-hole 110 such that the optical fiber cable 206 must exit the through-hole 110, which requires forming a sharp bend 208 in the optical fiber cable 206. Such a sharp bend 208 in the optical fiber cable 206 can reduce performance and/or require a more costly transition interconnection between the laser diode 104 and the optical fiber cable 206.

SUMMARY

Embodiments disclosed herein include an adapter for electrically connecting a laser diode to a circuit board. Related methods for coupling a laser diode to a circuit board are also described herein. An exemplary laser diode may form part of an optical communications system in which the laser diode emits optical signals into an optical fiber cable based on electrical signals received from one or more source circuits. The laser diode is electrically connected to the source circuit(s) through a circuit board, such as a printed circuit board (PCB). A laser diode adapter is provided to facilitate electrically connecting, as well as mechanically coupling, the laser diode to the circuit board. In this regard, the laser diode adapter includes conductive pads for coupling to conductive legs of the laser diode. The laser diode adapter also includes a set of conductive signal pads for coupling to conductive receiving pads which are electrically connected to the conductive pads, thereby electrically connecting the conductive legs of the laser diode to the circuit board.

In an exemplary aspect, the laser diode adapter has a width which spans a distance between at least a first conductive leg and a second conductive leg of the laser diode. In this manner, the laser diode adapter provides an electrical connection between the laser diode and the circuit board without deforming the conductive legs of the laser diode. The laser diode adapter may couple to a top surface of the circuit board, supporting the laser diode being coupled to an optical fiber cable without having a sharp bend in the optical fiber cable.

One embodiment of the disclosure relates to a laser diode adapter. The laser diode adapter includes a substrate having a first side, a second side opposite the first side, and a third side between the first side and the second side. The third side defines a thickness between the first side and the second side configured to span a distance between electrodes of a laser diode. The laser diode adapter also includes a first conductive pad disposed on the first side of the substrate adjacent the third side and a second conductive pad disposed on the second side of the substrate adjacent the third side. The laser diode adapter also includes a set of conductive signal pads disposed on the first side of the substrate and configured to couple the laser diode adapter to a circuit board.

An additional embodiment of the disclosure relates to a circuit assembly. The circuit assembly includes a circuit board, an electronic device, and an adapter coupled to the electronic device and coupled to the circuit board. The adapter includes a first side, which has a first conductive pad coupled to a first electrode of the electronic device and a set of conductive signal pads coupled to the circuit board. The adapter also includes a second side opposite the first side, which has a second conductive pad coupled to a second electrode of the electronic device. The first electrode and the second electrode of the electronic device are coupled to the first conductive pad and the second conductive pad respectively without being deformed.

An additional embodiment of the disclosure relates to a method of coupling a laser diode to a circuit board. The method includes the steps of bonding a set of conductive signal pads on a first side of an adapter to a corresponding set of conductive receiving pads on the circuit board. The method also includes bonding a first electrode of the laser diode to a first conductive pad on the first side of the adapter without deforming the first electrode. The method also includes bonding a second electrode of the laser diode to a second conductive pad on a second side of the adapter opposite the first side without deforming the second electrode.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

FIG. 4A is a bottom perspective view of the laser diode adapter of FIG. 3;

FIG. 4B is a top view of the laser diode adapter of FIG. 3;

DETAILED DESCRIPTION

Embodiments disclosed herein include an adapter for electrically connecting a laser diode to a circuit board. Related methods for coupling a laser diode to a circuit board are also described herein. An exemplary laser diode may form part of an optical communications system in which the laser diode emits optical signals into an optical fiber cable based on electrical signals received from one or more source circuits. The laser diode is electrically connected to the source circuit(s) through a circuit board, such as a printed circuit board (PCB). A laser diode adapter is provided to facilitate electrically connecting, as well as mechanically coupling, the laser diode to the circuit board. In this regard, the laser diode adapter includes conductive pads for coupling to conductive legs of the laser diode. The laser diode adapter also includes a set of conductive signal pads for coupling to conductive receiving pads which are electrically connected to the conductive pads, thereby electrically connecting the conductive legs of the laser diode to the circuit board.

In an exemplary aspect, the laser diode adapter has a width which spans a distance between at least a first conductive leg and a second conductive leg of the laser diode. In this manner, the laser diode adapter provides an electrical connection between the laser diode and the circuit board without deforming the conductive legs of the laser diode. The laser diode adapter may couple to a top surface of the circuit board, supporting the laser diode being coupled to an optical fiber cable without having a sharp bend in the optical fiber cable.

Figure 1:
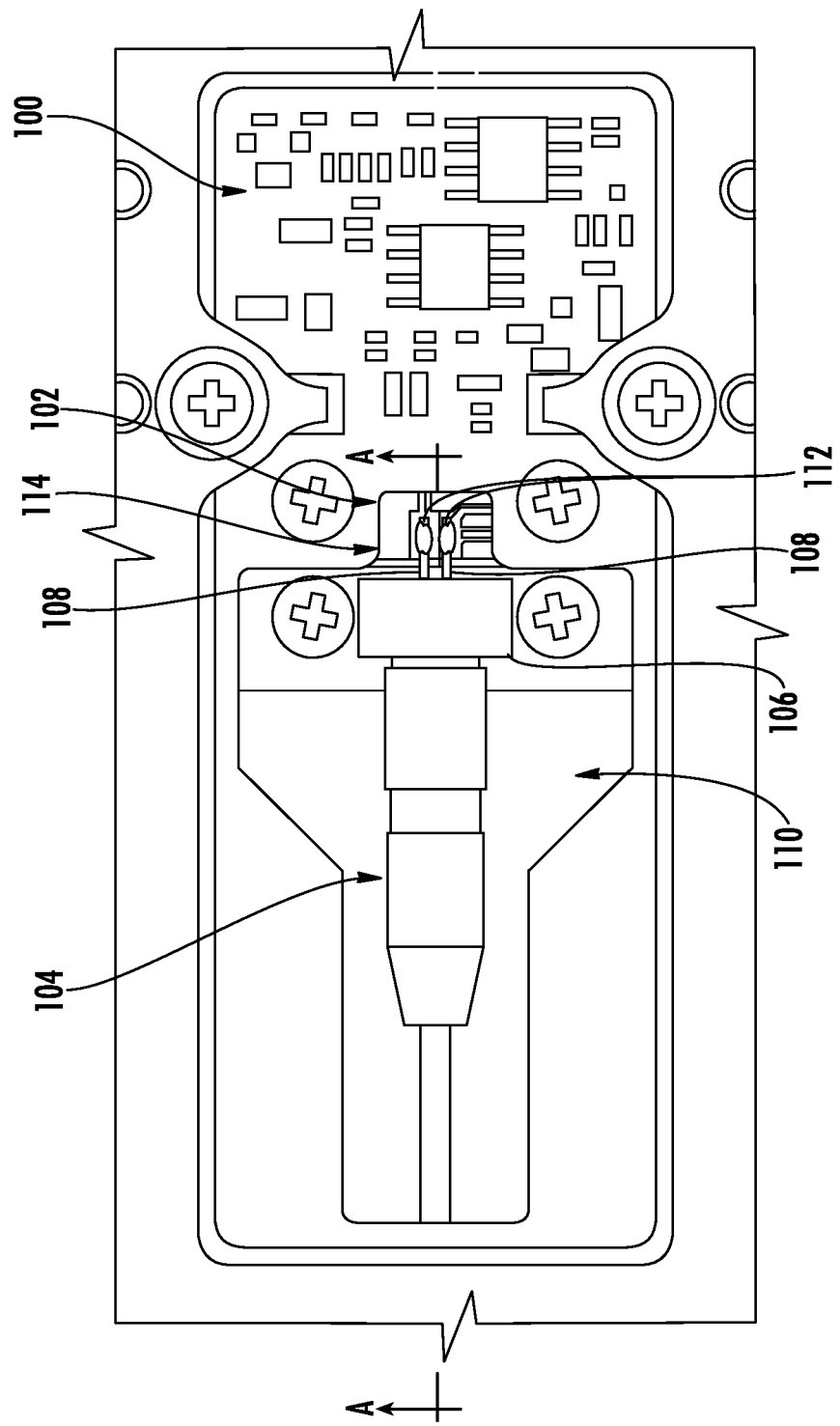
FIG. 1 is a schematic diagram of a multilayer printed circuit board (PCB) having a protruding portion of some layers for coupling to a laser diode.
Figure 2A:
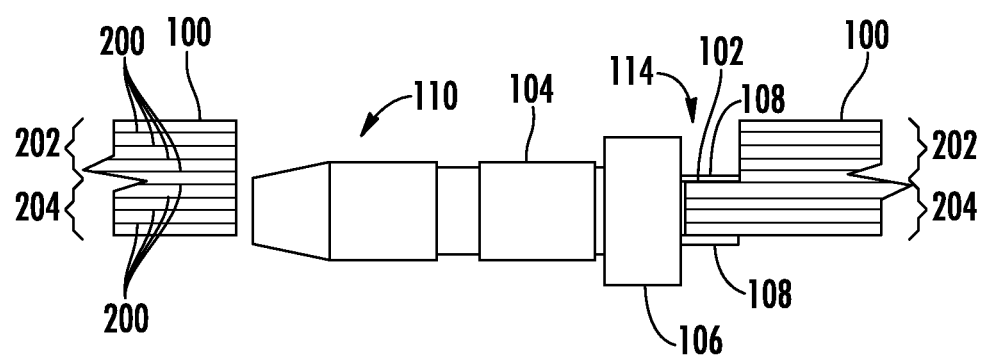
FIG. 2A is a schematic cross-sectional view of the multilayer PCB of FIG. 1 taken at line A-A, illustrating the layers of the multilayer PCB.
Figure 2B:
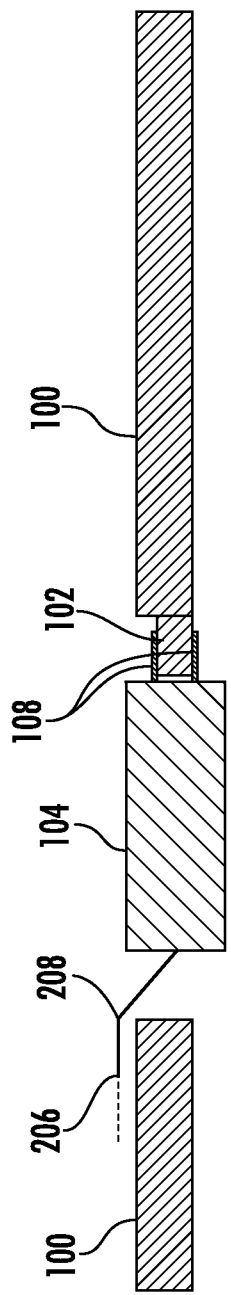
FIG. 2B is another schematic cross-sectional view of the multilayer PCB of FIG. 1 taken at line A-A.
Figure 3:
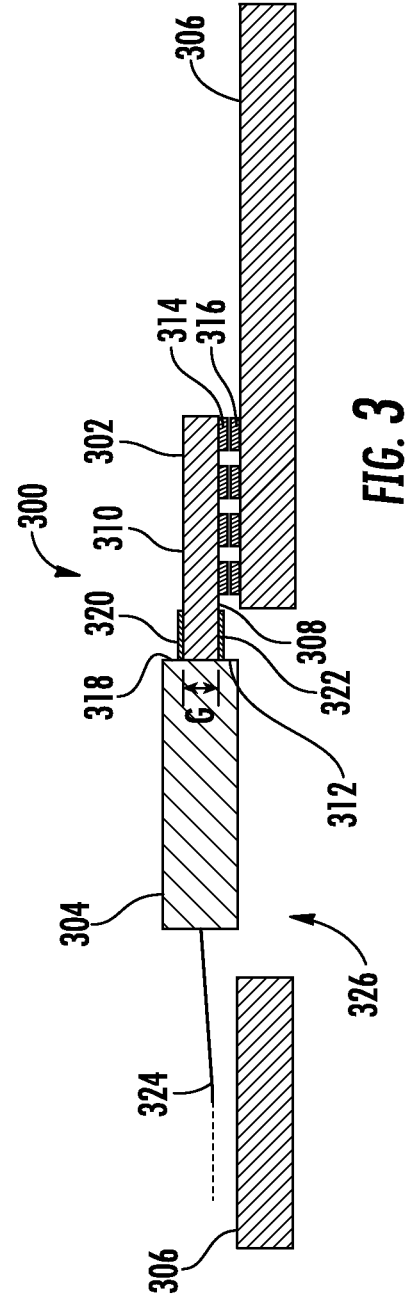
FIG. 3 is a schematic cross-sectional diagram of an exemplary circuit assembly including a laser diode adapter for coupling a laser diode to a circuit board.

In this regard, FIG. 3 is a schematic cross-sectional diagram of an exemplary circuit assembly 300 including a laser diode adapter 302 for coupling a laser diode 304 to a circuit board 306. The laser diode adapter 302 includes a bottom side (e.g., a first side) 308 and an opposing top side (e.g., a second side) 310. The laser diode 304 may couple to the bottom side 308 and the top side 310 of the laser diode adapter 302 at an end (e.g., a third side) 312, where it may form an electrical and mechanical connection, as illustrated further in FIGS. 5A-5C. A set of conductive signal pads 314 are disposed on the bottom side 308 of the laser diode adapter 302 as further illustrated in FIGS. 4A and 4B, and can be bonded or otherwise coupled to a corresponding set of conductive receiving pads 316 on the circuit board 306.

In an exemplary aspect, the laser diode 304 may be a conventional laser diode which includes a body having an enclosure. The enclosure can include a base 318 through which elongate conductive electrodes, leads, or legs 320, 322 extend. There may be one or more upper legs 320 and one or more lower legs 322. In the embodiment illustrated in the drawings, there are two upper legs 320 and two lower legs 322. The pair of upper legs 320 may extend in a common upper plane and the pair of lower legs 322 may extend in a common lower plane, wherein a distance or gap G is defined between the upper legs 320 and the lower legs 322. In this regard, at least one of the upper legs 320 and the lower legs 322 couples to the laser diode adapter 302 at the end 312, and a thickness of the laser diode adapter 302 defined between the bottom side 308 and the top side 310 (e.g., along the end 312) spans the gap G (e.g., the distance between the upper legs 320 and the lower legs 322).

In this manner, the laser diode adapter 302 is configured to couple to the laser diode 304 without bending or otherwise deforming the legs 320, 322 of the laser diode 304. As shown in FIG. 3 (and further illustrated in FIGS. 5A-5C), for each conductive electrode, lead, or leg 320, 322, the entire length of the leg 320, 322 that extends outwardly from the base 318 (e.g., the exposed portion of the leg 320, 322) extends straight and perpendicular to the plane of the exterior surface of the base 318. In practice, it may not be practical for the entire length of the exposed portion of each leg 320, 322 to extend perfectly straight and perpendicular to the plane of the exterior surface of the base 318. Therefore, reasonable tolerances (e.g., dimensional and/or angular variations) are within the scope of this disclosure, such that for at least some of and preferably (e.g., optionally) all of the legs 320, 322, substantially the entire length of the exposed portion of the leg 320, 322 may extend substantially straight and substantially perpendicular to the plane of the exterior surface of the base 318. In addition, it should be understood that where this disclosure refers to the thickness of the laser diode adapter 302 spanning the gap G, the thickness accommodates such reasonable tolerances in the distance between the upper legs 320 and the lower legs 322.

In aspects disclosed herein, the laser diode 304 forms part of an optical communications system in which electrical signals are converted to optical signals and transmitted between components of the communications system. Accordingly, the laser diode 304 is configured to transmit optical signals based on electrical signals received through the legs 320, 322. The electrical signals may be received from one or more source circuits electrically connected to the circuit board 306. The circuit board 306 may therefore be any appropriate circuit board 306, such as a conventional PCB, which includes a non-conductive substrate having electrical conductors laminated thereto and exposed electrical contacts, such as the set of conductive receiving pads 316, for interconnecting components mounted to the circuit board 306. The laser diode adapter 302 facilitates electrically connecting, as well as mechanically coupling, the laser diode 304 to the circuit board 306. In this regard, electrical signals from source circuits coupled to the circuit board 306 can conduct through the set of conductive receiving pads 316, through the laser diode adapter 302, and to the legs 320, 322 of the laser diode 304. In response to receiving the electrical signals at the legs 320, 322, the laser diode 304 transmits optical signals. Additional details of the laser diode adapter 302 are described below with respect to FIGS. 4A and 4B. Details of the interconnection between the circuit board 306, the laser diode adapter 302, and the laser diode 304 are described below with respect to FIGS. 5A-5C, and an exemplary process of coupling the laser diode 304 to the circuit board 306 is described below with respect to FIG. 6.

As shown in FIG. 3, an end of the laser diode 304 is generally coupled to an end of an optical fiber cable 324 for transmitting optical signals through the optical fiber cable 324 in response to the electrical signals supplied to the legs 320, 322 of the laser diode 304 from the laser diode adapter 302. The set of conductive signal pads 314 on the bottom side 308 of the laser diode adapter 302 are coupled to the corresponding set of conductive receiving pads 316 on the circuit board 306, thereby mounting the laser diode adapter 302 on top of a major surface (e.g., top surface) of the circuit board 306. Thus, coupling the laser diode 304 to the end 312 of the laser diode adapter 302 places the laser diode 304 at least partially above the circuit board 306 (as illustrated, a cavity or through-hole 326 may be defined in the circuit board 306 to accommodate a portion of the laser diode 304). The optical fiber cable 324 may accordingly couple to the laser diode 304 without having a sharp bend in the optical fiber cable 324, thereby improving performance and/or reducing cost of the interconnection between the optical fiber cable 324 and the laser diode 304.

It should be understood that FIG. 3 is exemplary in nature, and variations are within the scope of this disclosure. For example, at least a portion of the through-hole 326 may be omitted, and the laser diode adapter 302 may be mounted at an outer peripheral edge (e.g., side) of the circuit board 306. As another example, the laser diode 304 may be more generally referred to as a light-emitting diode, or even more generally as an electronic device. That is, it is within the scope of this disclosure for the laser diode 304 to be replaced with any other suitable electronic device(s), and thus the laser diode adapter 302 may also be considered to be an electronic device adapter.

FIG. 4A is a bottom perspective view of the laser diode adapter 302 of FIG. 3, and FIG. 4B is a top view of the laser diode adapter 302 of FIG. 3. With reference to FIGS. 4A and 4B, in an exemplary aspect the laser diode adapter 302 is formed as a PCB using appropriate techniques. In this regard, the laser diode adapter 302 includes a non-conductive substrate 400 having a bottom side (e.g., a first side) 308 and an opposing top side (e.g., a second side) 310 (the bottom side 308 and top side 310 may also be referred to herein as opposing major sides), each of which includes peripheral edges. In an exemplary aspect, the bottom side 308 is a first planar side of the conductive substrate 400, and the top side 310 is a second, parallel planar side. The laser diode adapter 302 further includes minor edges or sides respectively extending between the peripheral edges of the bottom side 308 and the top side 310, such as an end (e.g., a third side) 312 configured to couple to the laser diode 304 of FIG. 3.

With particular reference to FIG. 4A, the bottom side 308 of the laser diode adapter 302 includes at least a first conductive pad 402 disposed on the non-conductive substrate 400 adjacent the end 312. The first conductive pad 402 is configured to mechanically couple to a conductive electrode or leg of a laser diode, such as the laser diode 304 in FIG. 3, through an appropriate bonding (e.g., soldering, brazing, conductive adhesive, etc.). In addition, the first conductive pad 402 provides an electrical connection to a first conductive signal pad 404 of a set of conductive signal pads 314 disposed toward an opposite end of the bottom side 308 of the laser diode adapter 302. The set of conductive signal pads 314 are configured to mechanically and electrically couple to corresponding conductive receiving pads on a circuit board, such as the circuit board 306 in FIG. 3. A first conductor (e.g., conductive trace) 406 is disposed within the non-conductive substrate 400 and electrically connects the first conductive pad 402 to the first conductive signal pad 404.

With particular reference to FIG. 4B, the top side 310 of the laser diode adapter 302 includes at least a second conductive pad 408 disposed on the non-conductive substrate 400 adjacent the end 312. The second conductive pad 408 is configured to mechanically couple to a conductive electrode or leg of a laser diode, such as the laser diode 304 in FIG. 3, through an appropriate bonding (e.g., soldering, brazing, conductive adhesive, etc.). In addition, the second conductive pad 408 provides an electrical connection to a second conductive signal pad 410 of the set of conductive signal pads 314 disposed on the bottom side 308 of the laser diode adapter 302. A second conductor (e.g., conductive trace) 412 is disposed within the non-conductive substrate 400 and electrically connects the second conductive pad 408 to the second conductive signal pad 410.

With continued reference to FIGS. 4A and 4B, the end 312 between the bottom side 308 and the top side 310 of the laser diode adapter 302 has a thickness T defined between the bottom side 308 and the top side 310 which is configured to span a distance between electrodes (e.g., between the upper electrodes or legs 320 and lower electrodes or legs 322 of FIG. 3) of a laser diode, such as the laser diode 304 in FIG. 3. In this manner, the electrodes of the laser diode (or other electronic device) are coupled to the first conductive pad 402 and the second conductive pad 408 respectively without being deformed. In an exemplary aspect, the thickness T is defined according to the gap G of FIG. 3 and may accommodate reasonable tolerances in the gap G. Accordingly, the thickness T is between 0.6 and 0.8 mm, and may be 0.7 mm.

In some examples, a third conductive pad 414 is disposed on the bottom side 308 of the non-conductive substrate 400 adjacent the end 312. In addition, a fourth conductive pad 416 is disposed on the top side 310 of the non-conductive substrate 400 adjacent the end 312. Generally, the third conductive pad 414 is electrically isolated from the first conductive pad 402 and positioned opposite the second conductive pad 408. Similarly, the fourth conductive pad 416 is electrically isolated from the second conductive pad 408 and positioned opposite the first conductive pad 402. Each of the first conductive pad 402, the second conductive pad 408, the third conductive pad 414, and the fourth conductive pad 416 is sized to provide a bonding surface for the electrodes or legs 320, 322 of the laser diode, such as the laser diode 304 in FIG. 3. For example, the first conductive pad 402 couples to a first electrode (e.g., a lower leg 322), the second conductive pad 408 couples to a second electrode (e.g., an upper leg 320), the third conductive pad 414 couples to a third electrode (e.g., a lower leg 322), and the fourth conductive pad 416 couples to a fourth electrode (e.g., an upper leg 320). In some examples, the second conductive pad 408 is also electrically isolated from the first conductive pad 402. In an exemplary aspect, each conductive pad 402, 408, 414, 416 is between 0.4 mm and 0.7 mm wide, as defined along the end 312, and between 0.5 mm and 4 mm long.

In some examples, one or more mounting pads 418, 420, 422, 424 are disposed on the bottom side 308 of the non-conductive substrate 400, and may provide additional surface area for bonding (e.g., soldering) the laser diode adapter 302 to the circuit board 306 of FIG. 3. Some or all of the mounting pads 418, 420, 422, 424 may be connected to a fixed voltage (e.g., a circuit ground). In this regard, any conductive pad configured to be coupled to the fixed voltage may be referred to herein as a ground pad, such as one or more of the mounting pads 418, 420, 422, 424, and one or more of the set of conductive signal pads 314. A first mounting pad 418 may be disposed opposite the end 312, and may define a semicircular opening 426 through the bottom side 308 and the top side 310. The semicircular opening 426 may further accommodate a fastener, such as a screw, to further secure the laser diode adapter 302 to the circuit board and/or other components. A second mounting pad 420 can substantially span a length L of the laser diode adapter 302 adjacent a peripheral edge. A third mounting pad 422 and a fourth mounting pad 424 can be positioned adjacent another peripheral edge of the laser diode adapter 302.

In this regard, a width W of the laser diode adapter 302 may accommodate the conductive pads 402, 408, 414, 416, the set of conductive signal pads 314, and the mounting pads 418, 420, 422, 424. In an exemplary aspect, the width W is between 6.5 mm and 7.5 mm, and may be 7 mm. A length L of the laser diode adapter 302 is sufficient to provide a sufficient mounting area between the laser diode adapter 302 and the circuit board 306 in FIG. 3. In an exemplary aspect, the length L is between 11.5 mm and 12.5 mm, and may be 12 mm.

As noted above, the laser diode adapter 302 is formed as a PCB using appropriate techniques. Accordingly, forming the laser diode adapter 302 includes laminating a conductive sheet to each of the major sides (e.g., the bottom side 308 and the top side 310) of the non-conductive substrate 400. A resist coating is printed onto the exposed surface of each conductive sheet, and the portions of the conductive sheet that are not protected by the resist coating are chemically etched away, so that desired conductive traces (e.g., the first conductor 406, the second conductor 412, and ground conductors 428) are left intact. The non-conductive substrate 400 may comprise glass fibers and epoxy resin, and the conductive sheets and conductive traces may be copper, although any other suitable materials may be used. Alternatively, the conductive traces may be formed in any other suitable manner such as, but not limited to, mechanical milling.

In this manner, the first conductor 406 is disposed within the non-conductive substrate 400 and electrically connects the first conductive pad 402 to the first conductive signal pad 404. The second conductor 412 is similarly electrically connects the second conductive pad 408 to the second conductive signal pad 410. In addition, ground conductors 428 on each of the bottom side 308 and the top side 310 can connect the third conductive pad 414 and/or the fourth conductive pad 416 to one or more of the mounting pads 418, 420, 422, 424 (e.g., one or more ground pads).

At least some of the conductive traces (e.g., the first conductor 406, the second conductor 412, and the ground conductors 428) and/or other features, such as copper conductive pads (e.g., the conductive pads 402, 408, 414, 416, and the set of conductive signal pads 314) of the laser diode adapter 302 are connected to one another by way of conductive material extending through (e.g., lining) holes or vias 430 in the non-conductive substrate 400. In this regard, the second conductive pad 408 can be connected to the second conductive signal pad 410 through the second conductor 412 and a first via 432. In addition, the fourth conductive pad 416 can be connected to a ground pad (e.g., one or more of the mounting pads 418, 420, 422, 424 and/or one or more of the set of conductive signal pads 314 coupled to the fixed voltage) through one or more ground vias 434. Conductive pads 402, 408, 414, 416 may be respectively deposited or otherwise disposed on the non-conductive substrate 400, and conductive pads 402, 408, 414, 416 may be respectively connected to the vias 430 lined with conductive material in a conventional manner.

Figure 5A:
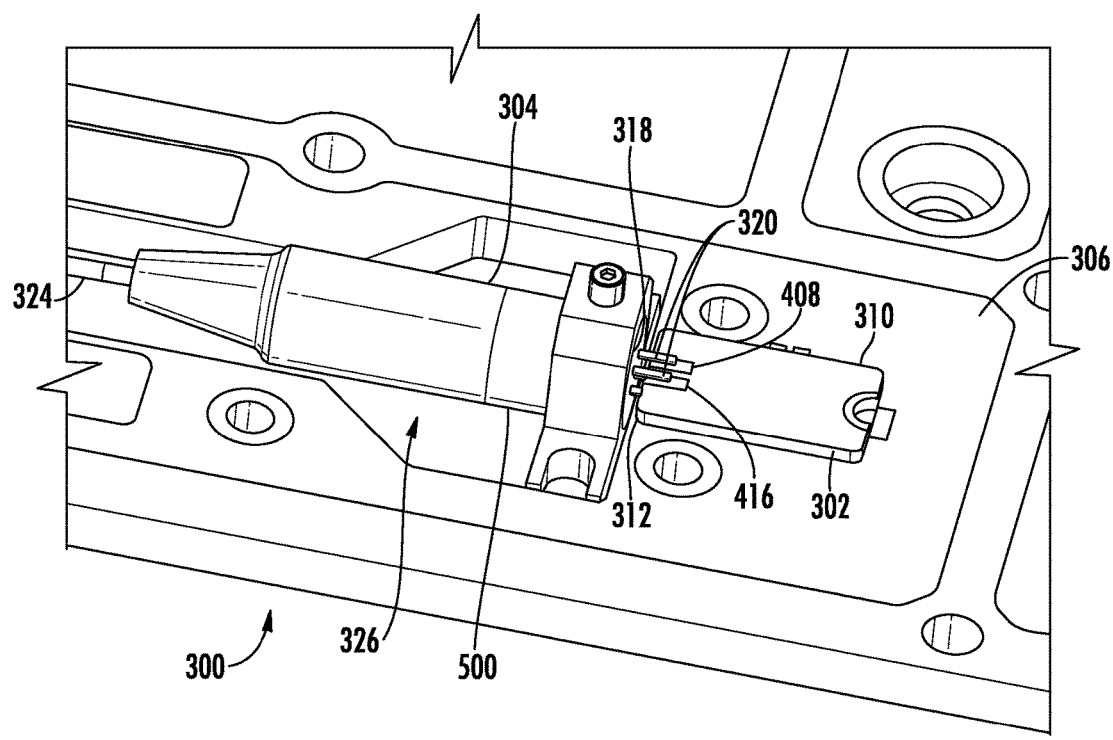
FIG. 5A is a top perspective view of the exemplary circuit assembly of FIG. 3.
Figure 5B:
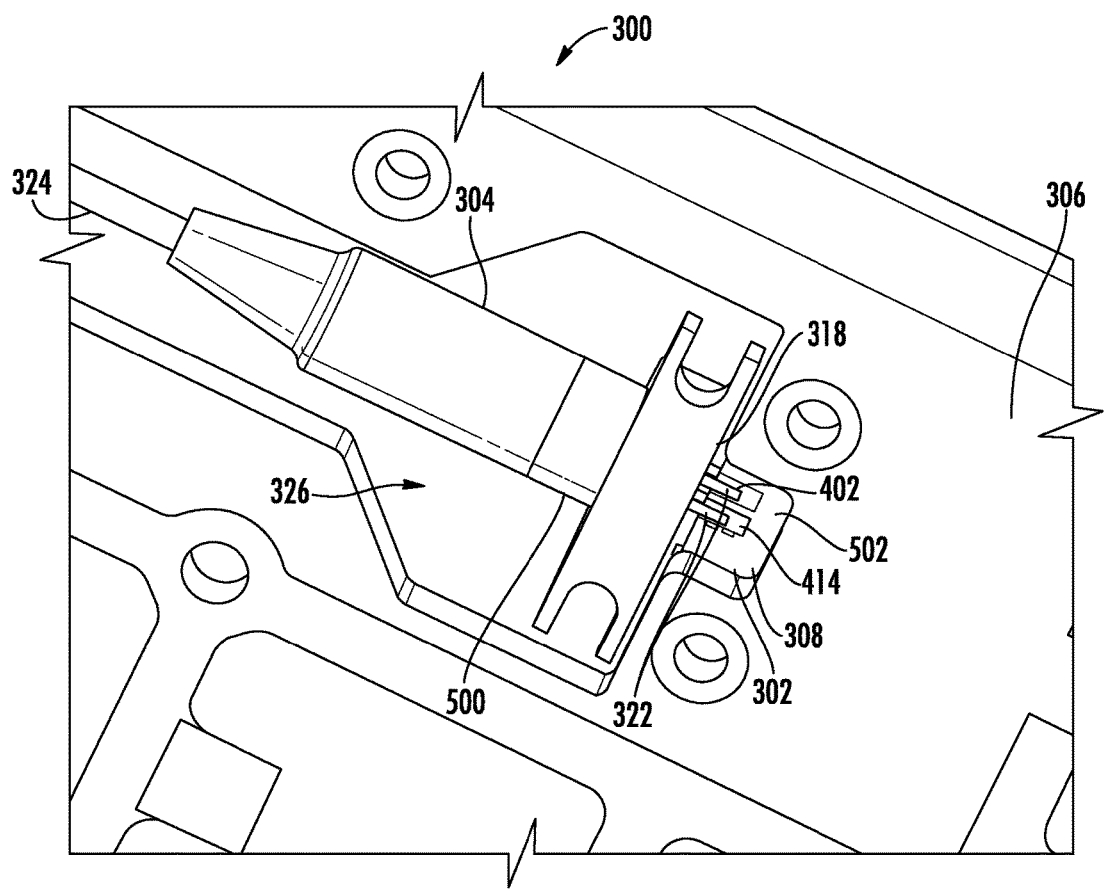
FIG. 5B is a bottom perspective view of the exemplary circuit assembly of FIGS. 3 and 5A.
Figure 5C:
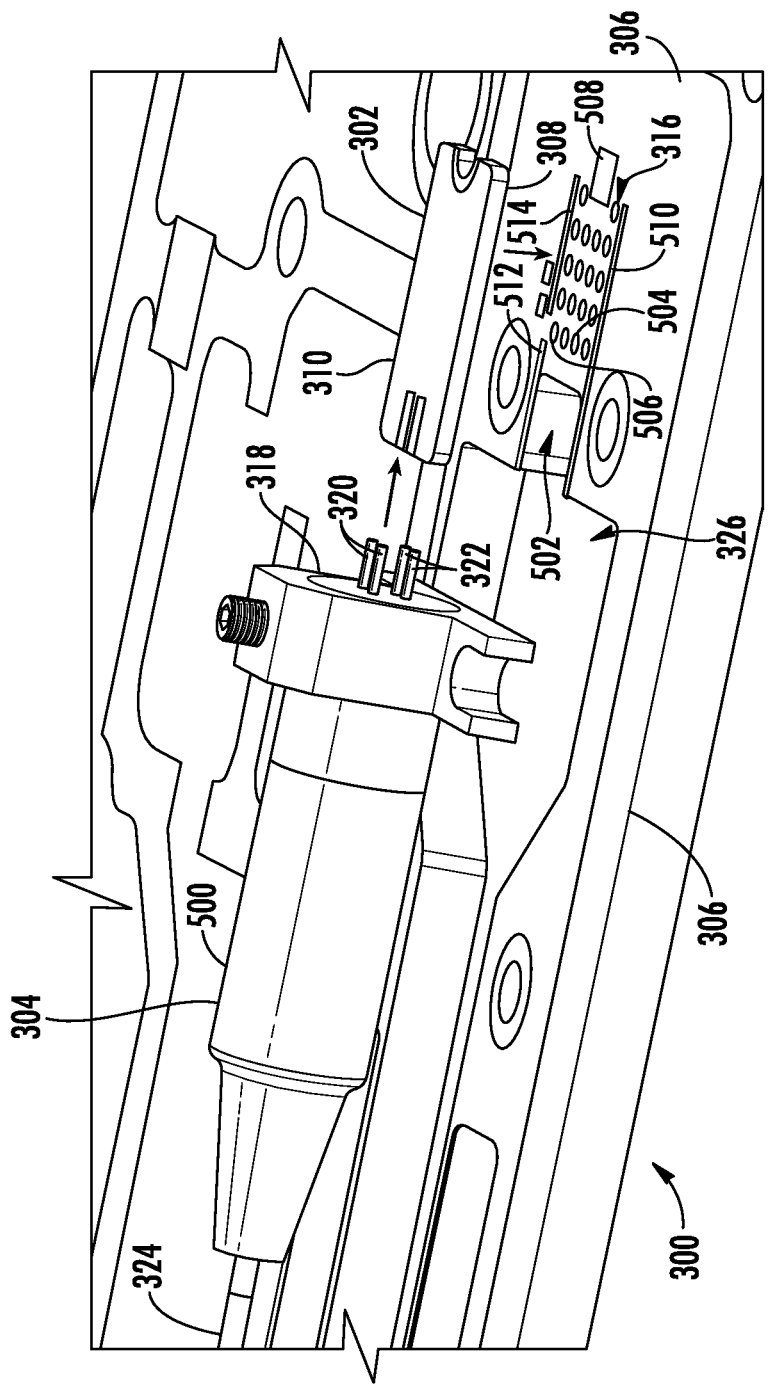
FIG. 5C is another schematic diagram of the exemplary circuit assembly of FIGS. 3, 5A, and 5B illustrating coupling the laser diode to the laser diode adapter and coupling the laser diode adapter to the circuit board.

Returning in greater detail to the circuit assembly 300, FIGS. 5A-5C show additional details of the circuit board 306, the laser diode adapter 302, and the laser diode 304. FIG. 5A is a top perspective view of the exemplary circuit assembly of FIG. 3. The laser diode 304 forms an electrical and mechanical connection at the end 312 of the laser diode adapter 302, and the laser diode adapter 302 in turn forms an electrical and mechanical connection with the circuit board 306.

In an exemplary aspect, the laser diode 304 may be a conventional laser diode which includes a body having an enclosure 500. The enclosure 500 can include a base 318 through which elongate upper electrodes or legs 320 and lower electrodes or legs 322 extend. When originally manufactured, the length of each of the legs 320, 322 of the laser diode 304 may be about 12 mm. Preferably (e.g., optionally), the ends of the legs 320, 322 are cut away to reduce the length of the legs 320, 322 to between 2.5 mm and 3.0 mm, and more specifically it is these legs 320, 322 of reduced length that may extend substantially straight and/or substantially perpendicularly to the base 318. These shortened legs 320, 322 are coupled (e.g., soldered) to the conductive pads 408, 416 of the laser diode adapter 302. Shortening the legs 320, 322 can improve electrical performance of the laser diode 304, and may additionally facilitate forming the circuit assembly 300. Generally, the legs 320, 322 extend perpendicular to the base 318 and parallel to each other. For example, each of the upper legs 320 extends parallel to a corresponding lower leg 322 (e.g., a first electrode which couples to the first conductive pad 402 extends parallel to a fourth electrode which couples to the fourth conductive pad 416, and the third electrode which couples to the third conductive pad 414 extends parallel to the second electrode which couples to the second conductive pad 408).

As depicted in FIG. 5A, the cavity or through-hole 326 defined in the circuit board 306 accommodates a portion of the laser diode 304. In addition, the upper legs 320 of the laser diode 304 are coupled to the second conductive pad 408 and the fourth conductive pad 416 respectively on the top surface 310 of the laser diode adapter 302 without bending or otherwise deforming the upper legs 320. The laser diode adapter 302 is mounted on top of a major surface of the circuit board 306, placing the laser diode 304 partially in the through-hole 326 and partially above the circuit board 306. In this manner, the optical fiber cable 324 couples to the laser diode 304 without having a sharp bend in the optical fiber cable 324, thereby improving performance and/or reducing cost of the interconnection between the optical fiber cable 324 and the laser diode 304.

FIG. 5B is a bottom perspective view of the exemplary circuit assembly 300 of FIGS. 3 and 5A. As depicted in FIG. 5B, the through-hole 326 defined in the circuit board 306 to accommodate a portion of the laser diode 304 can also include a notch 502 to accommodate the lower legs 322 of the laser diode 304 coupling to the laser diode adapter 302. Similar to the upper legs 320, the lower legs 322 are coupled to the first conductive pad 402 and the third conductive pad 414 respectively on the bottom surface 308 of the laser diode adapter 302 without bending or otherwise deforming the lower legs 322.

FIG. 5C is another schematic diagram of the exemplary circuit assembly 300 of FIGS. 3, 5A, and 5B illustrating coupling the laser diode 304 to the laser diode adapter 302 and coupling the laser diode adapter 302 to the circuit board 306. As depicted in FIG. 5C, the thickness of the laser diode adapter 302 (e.g., defined between the bottom side 308 and the top side 310) spans the distance or gap between the upper legs 320 and the lower legs 322 of the laser diode adapter 302. In this manner, the laser diode adapter 302 couples to the laser diode 304 without bending or otherwise deforming the electrodes or legs 320, 322 of the laser diode 304.

In addition, the laser diode adapter 302 includes a set of conductive signal pads (e.g., conductive signal pads 314 as shown in FIG. 4A) disposed on the bottom side 308, which couple to the corresponding set of conductive receiving pads 316 on the circuit board 306. For example, a first conductive receiving pad 504 of the set of conductive receiving pads 316 is electrically connected to the first conductive signal pad 404 of the set of conductive signal pads 314 of FIG. 4A, and thereby electrically connected to a lower leg 322 of the laser diode 304. In addition, a second conductive receiving pad 506 is electrically connected to the second conductive signal pad 408, and thereby electrically connected to an upper leg 320 of the laser diode 304. Mounting pads (e.g., mounting pads 418, 420, 422, 424 as shown in FIG. 4A) are also disposed on the bottom side 308 of the laser diode adapter 302, which couple to corresponding receiving ground pads 508, 510, 512, 514 on the circuit board 306. Some or all of the receiving ground pads 508, 510, 512, 514 may be connected to a fixed voltage (e.g., a circuit ground). For example, a first receiving ground pad 508 couples to the first mounting pad 418 of FIG. 4A. A second receiving ground pad 510 couples to the second mounting pad 420, a third receiving ground pad 512 couples to the third mounting pad 422, and a fourth receiving ground pad 514 couples to the fourth mounting pad 424.

In an exemplary aspect, the laser diode 304 is coupled to the laser diode adapter 302 by placing the laser diode adapter 302 between the upper legs 320 and the lower legs 322 (e.g., after shortening the legs 320, 322). The legs 320, 322 are further bonded to the corresponding conductive pads of the laser diode adapter 302 (e.g., the conductive pads 402, 408, 414, 416 in FIGS. 4A and 4B) through an appropriate technique, such as soldering. The bonded laser diode 304 and laser diode adapter 302 are then bonded to the circuit board 306 to form the circuit assembly 300. Bonding the laser diode adapter 302 to the circuit board 306 includes aligning the set of conductive signal pads (e.g., conductive signal pads 314 as shown in FIG. 4A) and mounting pads (e.g., mounting pads 418, 420, 422, 424 as shown in FIG. 4A) on the bottom side 308 of the laser diode adapter 302 with the corresponding set of conductive receiving pads 316 and receiving pads 504, 506, 508, 510 on the circuit board 306. The set of conductive signal pads and mounting pads on the laser diode adapter 302 are then bonded with the corresponding set of conductive receiving pads 316 and receiving pads 504, 506, 508, 510 on the circuit board 306 through an appropriate technique, such as reflow soldering, a conductive adhesive, and so on.

Figure 6:
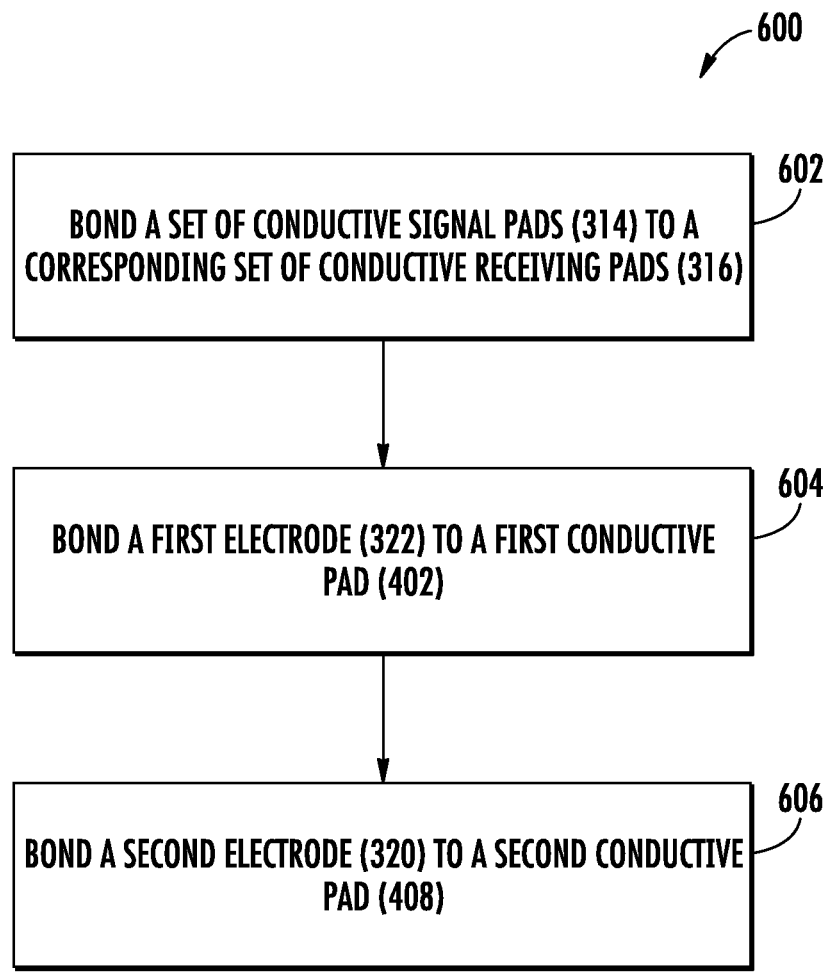
FIG. 6 is a flowchart illustrating an exemplary process of coupling the laser diode to the circuit board.

FIG. 6 is a flowchart illustrating an exemplary process 600 of coupling the laser diode 304 to the circuit board 306. With reference to FIGS. 3-6, the process 600 includes the steps of bonding a set of conductive signal pads 314 on the first side of an adapter (e.g., the laser diode adapter 302) to a corresponding set of conductive receiving pads 316 on the circuit board 306 (block 602). The process 600 also includes bonding a first electrode (e.g., one of the lower legs 322) of the laser diode 304 to a first conductive pad 402 on a first side (e.g., the bottom side 308) of the adapter without deforming the first electrode (block 604). The process 600 also includes bonding a second electrode (e.g., one of the upper legs 320) of the laser diode 304 to a second conductive pad 408 on a second side (e.g., the top side 310) of the adapter opposite the first side without deforming the second electrode (block 606).

It will be apparent to those skilled in the art that various modifications and variations can be made without departing from the spirit or scope of the invention.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips, that may be references throughout the above description, may be represented by voltages, currents, electromagnetic waves, magnetic fields, or particles, optical fields or particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

What is claimed is:

1. A circuit assembly, comprising:
   a circuit board comprising a set of conductive receiving pads;
   an electronic device; and
   an adapter coupled to the electronic device and coupled to the circuit board, comprising:
      a first side comprising:
         a first conductive pad coupled to a first electrode of the electronic device; and
         a set of conductive signal pads adjacent to and electrically coupled to the conductive receiving pads; and
      a second side opposite the first side and comprising a second conductive pad coupled to a second electrode of the electronic device;
      wherein the first electrode and the second electrode of the electronic device are coupled to the first conductive pad and the second conductive pad respectively without being deformed.

2. The circuit assembly of claim 1, wherein the set of conductive signal pads is bonded to the set of conductive receiving pads.

3. The circuit assembly of claim 2, wherein the adapter further comprises a non-conductive substrate on which the first conductive pad, the second conductive pad, and the set of conductive signal pads are disposed.

4. The circuit assembly of claim 3, further comprising:
   a first conductor disposed within the non-conductive substrate electrically connecting the first electrode of the electronic device with a first conductive signal pad of the set of conductive signal pads; and
   a second conductor disposed within the non-conductive substrate electrically connecting the second electrode of the electronic device with a second conductive signal pad of the set of conductive signal pads.

5. The circuit assembly of claim 3, wherein:
   the electronic device is a laser diode;
   the first electrode is a lower leg of the laser diode; and
   the second electrode is an upper leg of the laser diode.

6. The circuit assembly of claim 3, wherein:
   the first side of the adapter further comprises a third conductive pad electrically isolated from the first conductive pad and coupled to a third electrode of the electronic device extending parallel to the second electrode; and
   the second side of the adapter further comprises a fourth conductive pad electrically isolated from the second conductive pad and coupled to a fourth electrode of the electronic device.

7. The circuit assembly of claim 6, wherein:
   the first side of the adapter further comprises a ground pad electrically isolated from the first conductive pad; and
   the adapter further comprises:
      a non-conductive substrate on which the first conductive pad, the second conductive pad, the third conductive pad, the fourth conductive pad, the ground pad, and the set of conductive signal pads are disposed; and
      a ground conductor disposed within the non-conductive substrate electrically connecting the third conductive pad with the ground pad.

8. A method of coupling a laser diode to a circuit board, comprising:
   bonding a set of conductive signal pads on a first side of an adapter to a corresponding adjacent set of conductive receiving pads on the circuit board;
   bonding a first electrode of the laser diode to a first conductive pad on the first side of the adapter without deforming the first electrode; and
   bonding a second electrode of the laser diode to a second conductive pad on a second side of the adapter opposite the first side without deforming the second electrode.

9. The method of claim 8, wherein:
   the first side of the adapter is a first planar side;
   the second side of the adapter is a second planar side parallel to and opposite the first planar side; and
   a thickness of the adapter defined between the first planar side and the second planar side spans a distance between the first electrode and the second electrode of the laser diode.

10. The method of claim 8, further comprising:
    bonding a third electrode of the laser diode to a third conductive pad on the first side of the adapter and electrically isolated from the first conductive pad; and
    bonding a fourth electrode of the laser diode to a fourth conductive pad on the second side of the adapter and electrically isolated from the second conductive pad.

11. The method of claim 8, further comprising:
    bonding a ground pad disposed on the first side of the adapter to a receiving ground pad on the circuit board;
    wherein a ground conductor is disposed within a non-conductive substrate of the adapter electrically connecting the third conductive pad with the ground pad.

12. The circuit assembly of claim 1, wherein the circuit board overlaps the adapter.

13. The method of claim 8, wherein bonding a set of conductive signal pads on a first side of an adapter to a corresponding adjacent set of conductive receiving pads on the circuit board comprises bonding the respective pads while the circuit board overlaps the adapter.

\* \* \* \* \*